United States Patent [19]

Reynolds et al.

[11] Patent Number: 4,893,035

[45] Date of Patent: Jan. 9, 1990

[54] CASCADED LOW PASS/HIGH PASS FILTER PHASE SHIFTER SYSTEM

[75] Inventors: Leonard D. Reynolds, Jamaica Plain; Yalcin Ayasli, Lexington, both of Mass.

[73] Assignee: Hittite Microwave Corporation, Woburn, Mass.

[21] Appl. No.: 248,587

[22] Filed: Sep. 26, 1988

Related U.S. Application Data

[63] Continuation-in-part of Ser. No. 220,737, Jul. 18, 1988.

[51] Int. Cl.$^4$ .................. H03B 19/14; H03H 7/10; H03J 3/26; H03K 17/687

[52] U.S. Cl. .................. 307/520; 307/304; 328/167; 333/172; 333/173; 330/306

[58] Field of Search .............. 307/520, 450, 304, 572; 328/167; 333/172, 173; 330/303, 306

[56] References Cited

U.S. PATENT DOCUMENTS

| | | | |
|---|---|---|---|
| 3,257,631 | 6/1966 | Evans | 307/520 X |
| 3,522,519 | 8/1970 | Petersen | 307/572 X |
| 4,153,887 | 5/1979 | Poppa | 333/172 |
| 4,560,963 | 12/1985 | Sharpe | 333/172 |
| 4,723,113 | 2/1988 | Marcoux | 307/304 X |

Primary Examiner—Stanley D. Miller
Assistant Examiner—David R. Bertelson
Attorney, Agent, or Firm—Joseph S. Iandiorio; Brian M. Dingman

[57] ABSTRACT

A cascaded low pass/high pass filter phase shifter system including: a series of semiconductor switches each having a control electrode and first and second load electrodes; a capacitance connected in series between each control electrode and ground; an inductance connected in series between each second load electrode of one semiconductor switch and the first load electrode of the adjacent semiconductor switch in the series; and means for selectively applying a control signal to each said control electrode for switching the associated semiconductor switch between a first state in which it operates as a low pass filter and a second state in which it operates as a high pass filter to introduce a phase shift in a propagated signal.

8 Claims, 4 Drawing Sheets

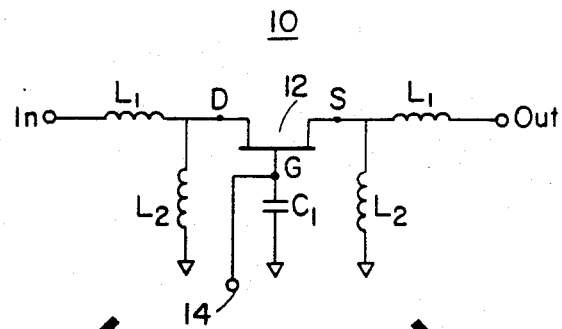
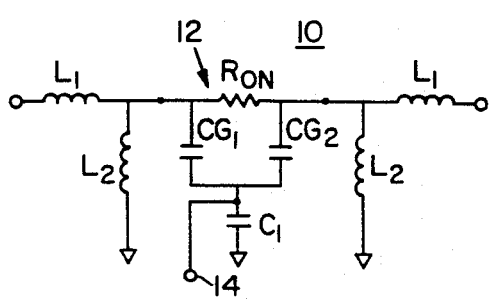 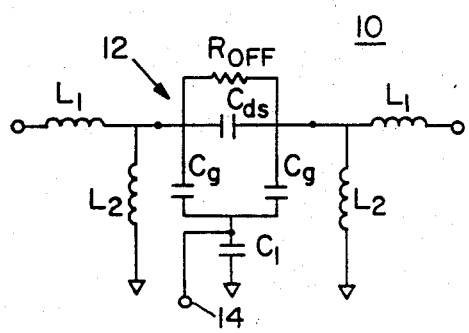
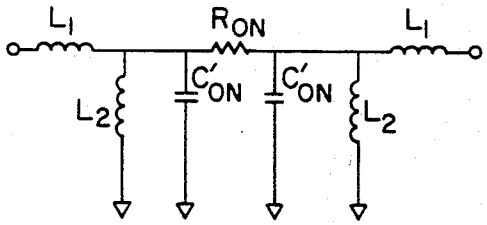 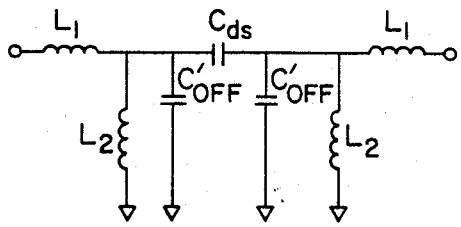
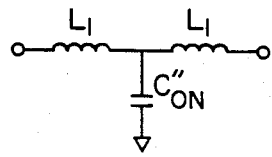 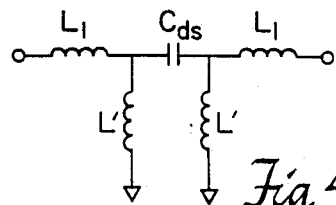

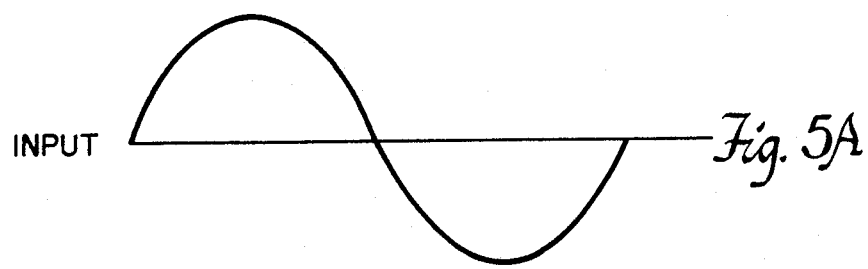
INPUT — Fig. 5A
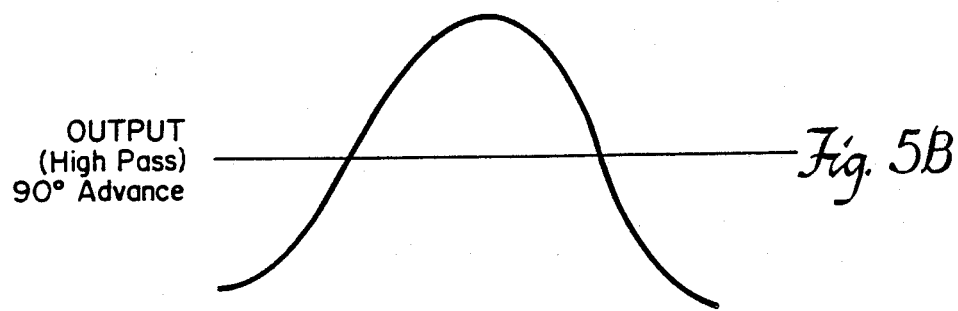
OUTPUT
(High Pass)
90° Advance — Fig. 5B
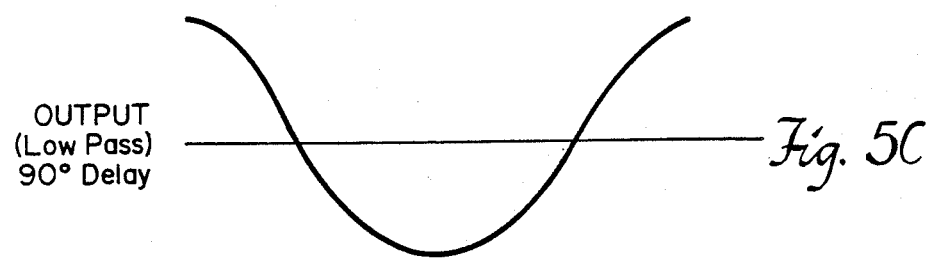
OUTPUT
(Low Pass)
90° Delay — Fig. 5C

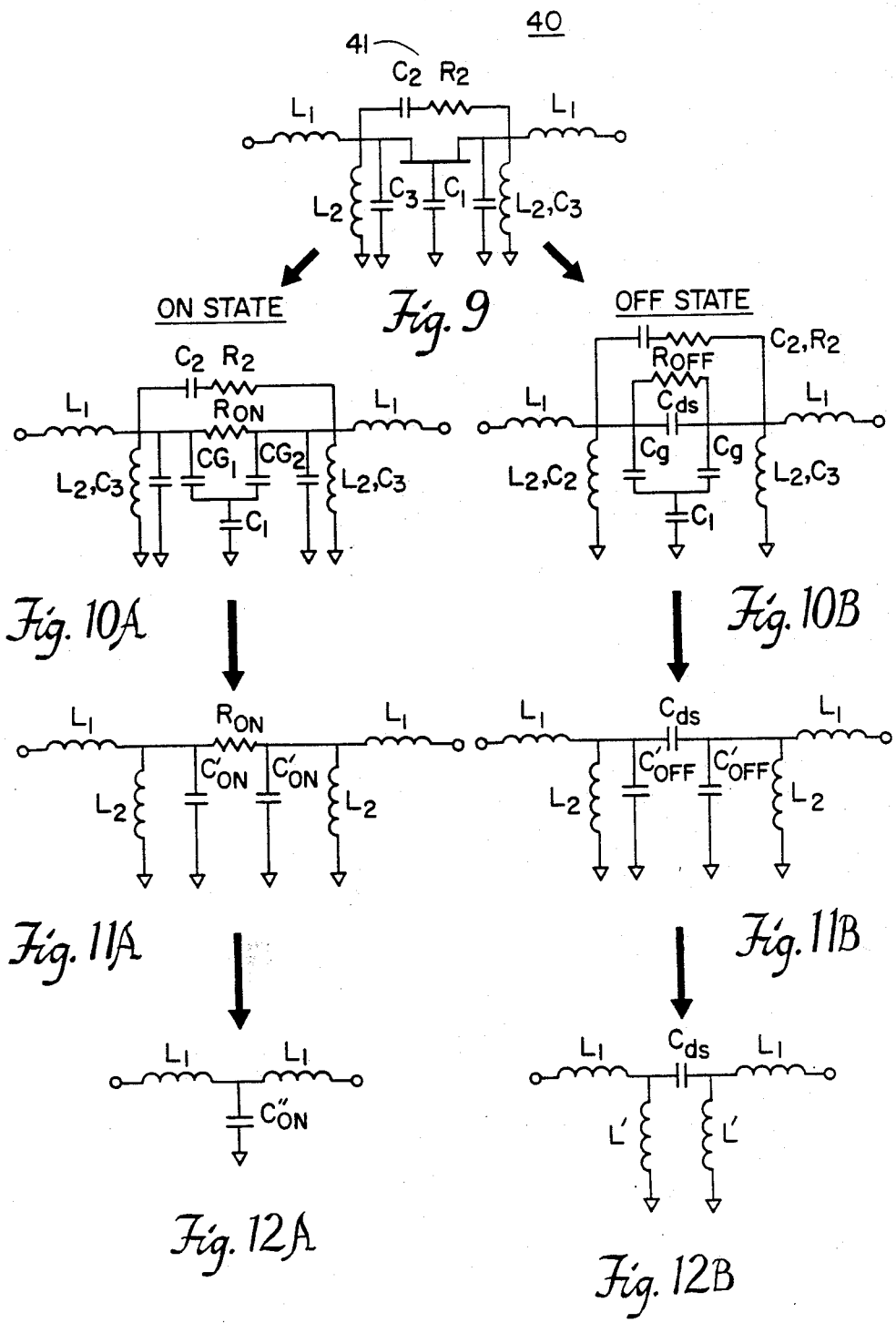

CASCADED LOW PASS/HIGH PASS FILTER PHASE SHIFTER SYSTEM

CONFIRMATORY LICENCE

The U.S. Government has a paid-up license in this invention as provided for by the terms of contract No. F19628-85-C-00889 awarded by the U.S. Air Force.

CROSS REFERENCE

This is a continuation-in-part of U.S. Ser. No. 220,737 filed July 18, 1988 entitled "Low Pass/High Filter Phase Shifter" by Yalcin Ayasli.

FIELD OF INVENTION

This invention relates to an improved monolithic cascaded phase shifter system.

SUMMARY OF INVENTION

It is an object of this invention to provide an improved phase shifter system which is small in area requiring only 2% of the area of the early monolithic phase shifter systems.

It is a further object of this invention to provide an improved cascaded phase shifter system which affords greater simplicity, reduction in size and ease of fabrication.

The invention features a cascaded compact low pass-/high pass filter phase shifter system which includes a plurality of phase shifter circuits. The system includes a series of semiconductor switches each having a control electrode and first and second load electrodes. A capacitance is connected in series between each of the control electrodes and ground. An inductance is connected between each second electrode of one semiconductor and the first electrode of the adjacent semiconductor switch in the series. These inductances may be connected in series between those first and second electrodes or may be connected in parallel from the junction of those first and second electrodes to ground. There are means for selectively applying a control signal to each control electrode for switching that semiconductor switch between the first state in which it operates as a low pass filter and a second state in which it operates as a high pass filter to introduce a phase shift in a propagated signal.

DISCLOSURE OF PREFERRED EMBODIMENT

Other objects, features and advantages will occur from the following description of a preferred embodiment and the accompanying drawings, in which:

FIG. 1 is a schematic of a phase shifter circuit according to this invention;

FIG. 2A is an equivalent representation of the circuit of FIG. 1 in the on state;

FIG. 2B is an equivalent representation of the circuit of FIG. 1 in the off state;

FIGS. 3A and 3B are equivalent circuit simplifications of FIGS. 2A and 2B;

FIGS. 4A and 4B are further equivalent circuit simplifications of FIGS. 3A and 3B;

FIGS. 5A, 5B and 5C illustrate an input wave and the phase shifts obtainable with the circuit according to this invention;

FIG. 9 is a schematic of another phase shifter circuit according to this invention;

FIG. 10A is an equivalent representation of the circuit of FIG. 9 in the on state;

FIG. 10B is an equivalent representation of the circuit of FIG. 1 in the off state;

FIGS. 11A and 11B are equivalent circuit simplifications of FIGS. 10A and 10B; and FIGS. 12A and 12B are further equivalent circuit simplifications of FIGS. 11A and 11B.

Figure 6:
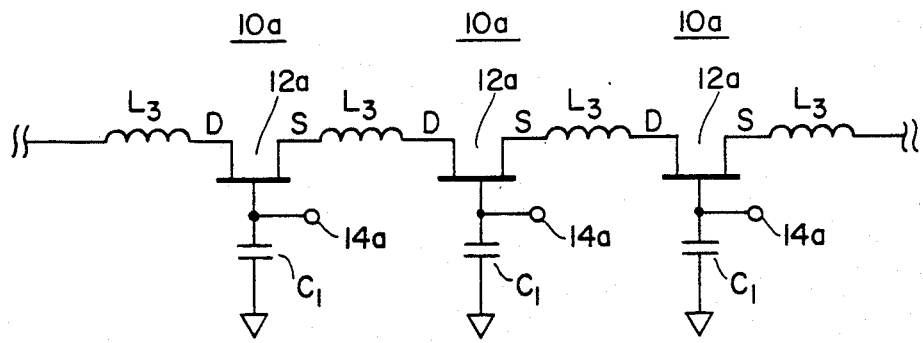
FIG. 6 is a system applying a number of the phase shifters of FIG. 1 in a simplified form as used in a cascade connection with series inductances.

The invention may be accomplished with a cascaded phase shifting system by cascading a number of circuits using a semiconductor switch such as an FET with its gate connected through a capacitor to ground and with its drain and source electrodes each connected in series with an inductance and with additional inductances connected from each of the drain and source electrodes to ground. The circuit is symmetrical with a central FET, a gate capacitor and a series and parallel inductance at the input and the output. It uses a minimum of components, e.g., only one semiconductor, and is extremely small in area. Further, when arranged in cascade or series in order to provide increased capacity for phase shifting, either the series inductances or the parallel inductances can be omitted and the remaining inductance can be shared between adjacent semiconductors or FETs. Thus, the cascade would, for example, have a number of FETs each with its gate connected to ground through a capacitor, and between the drain of each FET and the source of the neighboring FET there would be an inductance either connected directly in series between those electrodes or connected from the junction of those electrodes to ground so that in cascade the circuit reduces to an even simpler design than in the single, stand-alone state.

There is shown in FIG. 1 a phase shifter circuit 10 which may be used in this invention which includes a semiconductor such as FET 12 having its gate G connected through capacitor $C_1$ to ground and having its drain and source each connected to an inductance $L_1$. In addition, each of the drain and source is connected through a second inductance $L_2$ to ground. There is some means for applying a control signal to the gate of FET 12 such as terminal 14.

In a specific application where it is desired, an approximately 50 ohm input impedance and a 50 ohm output impedance is obtained using a capacitor $C_1$ which has a value in the range of 1 pF, inductances $L_1$ and $L_2$ which have an inductance in the range of 1 nanoHenry and an FET which has an approximately 1 millimeter gate periphery.

When a zero volt bias is applied to terminal 14, phase shifter circuit 10 switches to the on state in which it is a low pass filter that passes at least up to, for example, 11 GHz. With a $-5$ volt bias applied to terminal 14, the circuit switches to its off state in which it becomes a high pass filter and passes, for example, 9 GHz and over, so that in summary circuit 10 operates as a 10 GHz plus or minus 10% band pass filter. In the on state, as shown in FIG. 2A, the equivalent circuit appears as before with respect to inductances $L_1$, $L_2$ and capacitance $C_1$ but FET 12 is now represented by its conducting resistance $R_{on}$, and capacitances $CG_1$ and $CG_2$ where $R_{on}$ is a negligible resistance typically in the order of 4 ohms, for example. The equivalent circuit of FIG. 2A can be further simplified, as shown in FIG. 3A, where capacitances $CG_1$, $CG_2$ and $C_1$ are resolved into only two capacitances $C'_{on}$ and $C'_{on}$. Finally, as shown in FIG. 4A, since $R_{on}$ is negligible the circuit reduces to a simple low pass filter with two inductances $L_1$ and $L_1$ and one capacitance $C''_{on}$. The impedance of parallel inductances $L_2$ are such that they may be disregarded with respect to the capacitances $C'_{on}$ in FIG. 3A so that the simplified equivalent circuit becomes as shown in FIG. 4A.

With a $-5$ volt signal applied to terminal 14, phase shifter 10 switches to the off state and assumes the equivalent circuit condition, as shown in FIG. 2B. There FET 12 in the off condition is represented by its off resistance $R_{off}$, its drain and source capacitance $C_{ds}$ and the gate capacitance $C_g$. This circuit can be simplified, as shown in FIG. 3B, so that $R_{off}$ which is in the neighborhood of 2000 ohms becomes negligible in view of the much lower reactance or impedance of the capacitance $C_{ds}$. The three capacitances $C_g$, $C_g$ and $C_1$ can be simplified into capacitance $C'_{off}$, and the final simplification of FIG. 4B shows that the capacitances $C'_{off}$ and the inductances $L_2$ can be represented by the simple inductances $L'$ so that the entire circuit takes on the appearance of a high pass filter.

In operation a sinusoidal signal, such as shown in FIG. 5A, presented at the input of phase shifter 10 can be advanced by 90 degrees, as shown in FIG. 5B, by providing a $-5$ volt bias at terminal 14 to drive circuit 10 to the off state, or the output can be imparted with a 90-degree delay, as shown in FIG. 5C when a zero volt bias is provided to terminal 14 to switch circuit 10 to the on state. If either the 90-degree advance position or 90-degree delay position is assumed as a base position, then it can be seen that the simplified symmetrical phase shifter circuit 10 can be used to provide a 180 degree phase shift.

When arranged in cascade or series, according to this invention circuit 10 is further simplified, as shown by circuits 10a in system 20 in FIG. 6. There, each FET 12a still has associated with it a terminal 14a and a capacitance $C_1$ as before, but it now includes only one inductance $L_3$ which is connected in series between the load electrodes or the source and drain electrodes of the neighboring FETs. Thus, while maintaining symmetry the individual phase shifter circuits 10a have been even further simplified from that shown in circuit 10, FIG. 1.

Figure 7:
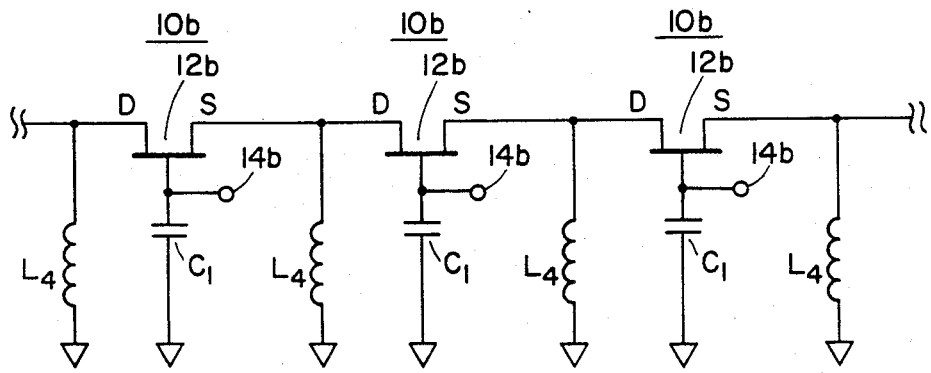
FIG. 7 is a system applying a number of the phase shifters of FIG. 1 in a simplified form as used in a cascade connection with parallel inductances.
Figure 8:
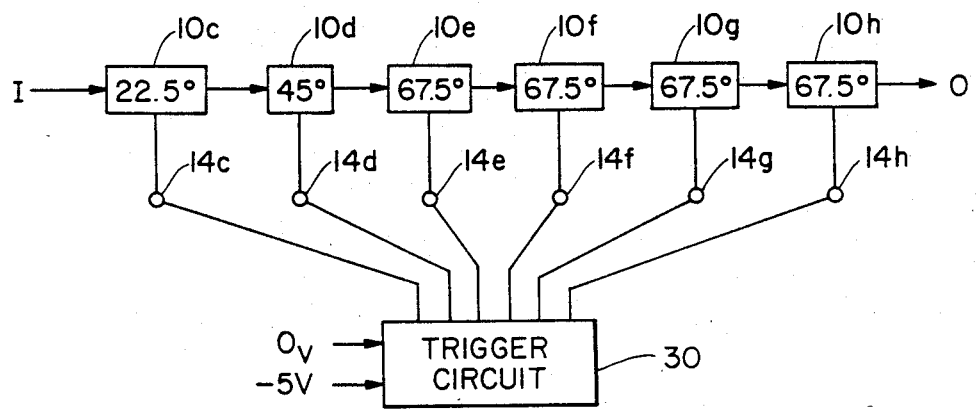
FIG. 8 is a simplified block diagram showing the operation of a phase shifting system such as shown in FIGS. 6 and 7.

Alternatively, according to this invention a phase shifter system 20b, FIG. 7, can be formed using a plurality of FETs 12b and capacitor $C_1$ but with the drain and source inductances connected in parallel to ground as indicated by inductances $L_4$. Here, too, the symmetry is preserved and the circuit further simplified with respect to circuit 10 of FIG. 1. Such a series connected or cascade system is useful to provide a stepped or variable phase shift. For example, as shown in FIG. 8, a phase shifting system according to this invention may include a plurality of phase shifter circuits 10c, d, e, f, g and h whose imparted phase shift is 22 ½ degrees, 45 degrees, 67 ½ degrees, 67 ½ degrees, 67 ½ degrees and 67 ½ degrees, respectively. By providing each of these circuits with a zero or $-5$ volt switching bias at their control terminals 14c through 14h, trigger circuit 30 can be used to introduce anywhere from 22 ½ degrees up to 360 degrees of phase shift in steps of 22 ½ degrees.

In some applications of phase shifter circuit 10 design flexibility or enhanced performance result from inclusion of impedance network 41 between the two load electrodes, as shown in FIG. 9. The resulting circuit 40 can be analytically reduced to low pass and high pass circuits, FIGS. 10-12, as was circuit 10, and may be used in the two series or cascaded connections 20(a) and 20(b) as shown for circuit 10. The operation and performance of the circuit in the ON STATE is unaffected. In the OFF STATE the circuit 40 is less sensitive to FET manufacturing process tolerances, and can be more easily adjusted in design to balance signal amplitude and phase performance requirements.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A cascaded low pass/high pass filter phase shifter system comprising:
   a series of semiconductor switches each having a control electrode and first and second load electrodes;
   a capacitance connected in series between each said control electrode and ground;
   an inductance connected in series between each second load electrode of one semiconductor switch and the first load electrode of the adjacent semiconductor switch in the series;
   means for selectively applying a control signal to each said control electrode for switching the associated semiconductor switch between a first state in which it operates as a low pass filter and a second state in which it operates as a high pass filter to introduce a phase shift in a propagated signal.

2. The system of claim 1 further including a capacitance connected between each load electrode and ground.

3. The system of claim 1 further including an impedance shunt connected between said load electrodes.

4. The system of claim 3 in which said impedance shunt includes a resistance and capacitance connected in series.

5. A cascaded low pass/high pass filter phase shifter system comprising:
   a series of semiconductor switches each having a control electrode and first and second load electrodes;
   a capacitance connected in series between each said control electrode and ground;
   an inductance connected in parallel from the junction between the second load electrode of one semiconductor switch and the first load electrode of an adjacent semiconductor switch in the series to - ground;
   means for selectively applying a control signal to each said control electrode for switching the associated semiconductor switch between a first state in which it operates as a low pass filter and a second state in which it operates as a high pass filter to introduce a phase shift in a propagated signal.

6. The system of claim 5 further including a capacitance connected between each load electrode and ground.

7. The system of claim 5 further including an impedance shunt connected between said load electrodes.

8. The system of claim 7 in which said impedance shunt includes a resistance and capacitance connected in series.

* * * * *